United States Patent
Dietrich et al.

(10) Patent No.: US 10,134,482 B2
(45) Date of Patent: Nov. 20, 2018

(54) APPARATUSES AND METHODS FOR HIGH SPEED WRITING TEST MODE FOR MEMORIES

(71) Applicant: MICRON TECHNOLOGY, INC., Boise, ID (US)

(72) Inventors: Stefan Dietrich, Türkenfeld (DE); Wolfgang Spirkl, Germering (DE)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 15/408,272

(22) Filed: Jan. 17, 2017

(65) Prior Publication Data
US 2018/0204630 A1 Jul. 19, 2018

(51) Int. Cl.
| | | |
|---|---|---|
| G11C 7/10 | (2006.01) | |
| G11C 29/38 | (2006.01) | |
| G11C 29/18 | (2006.01) | |
| G11C 29/36 | (2006.01) | |

(52) U.S. Cl.
CPC .............. *G11C 29/38* (2013.01); *G11C 29/18* (2013.01); *G11C 29/36* (2013.01)

(58) Field of Classification Search
CPC ..... G11C 16/10; G11C 7/1078; G11C 7/1084; G11C 7/1096
See application file for complete search history.

(56) References Cited

U.S. PATENT DOCUMENTS

| | | | | |
|---|---|---|---|---|
| 5,629,943 A | * | 5/1997 | McClure ................ | G11C 29/02 365/201 |
| RE37,753 E | * | 6/2002 | Kyung ................. | G11C 7/1006 365/230.01 |
| 6,643,720 B2 | * | 11/2003 | Takeda ................. | G11C 7/1027 710/1 |
| 7,911,861 B2 | | 3/2011 | Ishikawa et al. | |
| 2006/0023554 A1 | * | 2/2006 | Matsushita ........... | G11C 16/32 365/230.03 |
| 2006/0285424 A1 | * | 12/2006 | Gregorius ............ | G11C 7/1051 365/233.1 |
| 2008/0043532 A1 | * | 2/2008 | Hara ...................... | G11C 16/10 365/185.12 |
| 2008/0094890 A1 | * | 4/2008 | Kim ...................... | G11C 29/26 365/185.2 |

(Continued)

OTHER PUBLICATIONS

Agilent Technologies, Inc.; "Application Note: Making Accurate Measurements;" Retrieved from http://cp.literature.agilent.com/litweb/pdf/5990-6130EN.pdf (Oct. 2009, Printed in U.S.A. Jun. 2010).

(Continued)

*Primary Examiner* — Tuan T Nguyen
(74) *Attorney, Agent, or Firm* — Dorsey & Whitney LLP

(57) ABSTRACT

Apparatuses and methods are provided for a high speed writing test mode for memories. An example apparatus includes a memory core, a data terminal coupled to a data receiver, a read buffer coupled between the data terminal and the memory core, and a write buffer coupled between the data receiver and the memory core. The write buffer may include at least a first input coupled to the data receiver, and a second input. While in a test mode, the write buffer may be loaded with data from the second input instead of the first input.

10 Claims, 6 Drawing Sheets

(56) References Cited

U.S. PATENT DOCUMENTS

2011/0010493 A1* 1/2011 Kimura .................. G11C 11/22
711/103

OTHER PUBLICATIONS

Micron Technology, Inc.; "Technical Note: TN-ED-01: GDDR5 SGRAM Introduction;" Technical Notes; Retrieved from https://www.micron.com/resource-details/9442b768-28ed-476c-820b-143db9cbbc0f (Feb. 2014).

Micron Technology, Inc.;"GDDR5X SGRAM: 8Gb: x16, x32 GDDR5X SGRAM;" Data Sheet; Retrieved from https://www.micron.com/resource-details/a3cada97-b50f-46dc-bd2f-40a60a5f09ad (May 2016).

* cited by examiner

APPARATUSES AND METHODS FOR HIGH SPEED WRITING TEST MODE FOR MEMORIES

BACKGROUND

Current and future generation DRAM and SDRAM applications utilize very high I/O speeds. This is particularly true in graphics memory, such as current and future generation GDDR5/GDDR5X specifications. Graphics memories are designed for applications requiring high bandwidths and high I/O speeds, for example, in excess of 8 Gbps. However, current and next generation chips, such as GDDR5 for example, employ narrower memory interfaces, such as narrower memory bus widths, and reduced chip size relative to previous generations.

Increasing speeds and smaller footprints generally result in smaller signal amplitude and smaller data valid windows. Test system cost tends to increase rapidly, and eventually, as signal quality to the DRAM degrades, existing and affordable test solutions become unable to deliver signals correctly into the memory array for testing. Thus, a circuit for implementing a test mode is provided which allows write data to be tested at full system speed, e.g. without changing the system clock frequency, but with reduced signal integrity requirements.

BRIEF DESCRIPTION OF THE DRAWINGS

A further understanding of the nature and advantages of particular embodiments may be realized by reference to the remaining portions of the specification and the drawings, in which like reference numerals are used to refer to similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
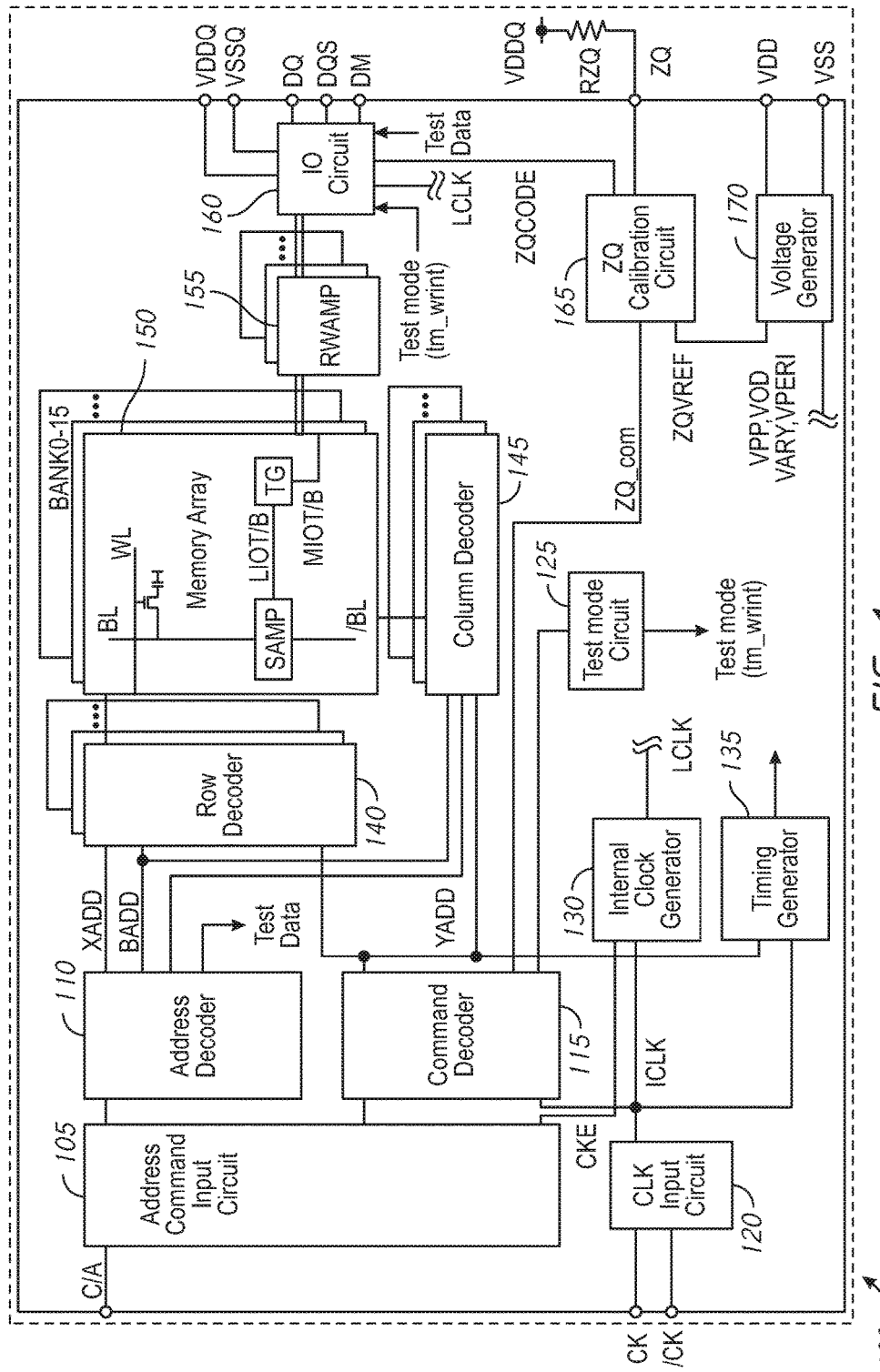
FIG. 1 is a schematic block diagram of a semiconductor device, in accordance with various embodiments.

FIG. 1 illustrates a schematic block diagram of a semiconductor device 100, in accordance with various embodiments. The semiconductor device 100 includes a memory die. The memory die may include an address/command input circuit 105, address decoder 110, command decoder 115, clock input circuit 120, internal clock generator 130, timing generator 135, row decoder 140, column decoder 145, memory arrays 150, read/write amplifiers 155, I/O circuit 160, ZQ calibration circuit 165, and voltage generator 170.

In some embodiments, the semiconductor device 100 may include, without limitation, a DRAM device, such as GDDR5 SGRAM integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 100 may employ a plurality of external terminals that include address and command terminals coupled to command/address bus (C/A), clock terminals CK and/CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 105, to an address decoder 110. The address decoder 110 receives the address signal and supplies a decoded row address signal to the row decoder 140, and a decoded column address signal to the column decoder 145. The address decoder 110 also receives the bank address signal and supplies the bank address signal to the row decoder 140, the column decoder 145.

The command/address terminals may further be supplied with a command signal from outside, such as, for example, a memory controller 105. The command signal may be provided, via the C/A bus, to the command decoder 115 via the address/command input circuit 105. The command decoder 115 decodes the command signal to generate various internal commands that include a row command signal to select a word line and a column command signal, such as a read command or a write command, to select a bit line, and a test mode signal. The test mode signal may be provided to a test mode circuit 125, which will be discussed in greater detail below.

Accordingly, when a read command is issued and a row address and a column address are timely supplied with the read command, read data is read from a memory cell in the memory array 150 designated by these row address and column address. The read data DQ is output to outside from the data terminals DQ, DQS, and DM via read/write amplifiers 155 and an input/output circuit 160. Similarly, when the write command is issued and a row address and a column address are timely supplied with this command, and then write data is supplied to the data terminals DQ, DQS, DM, the write data is received by data receivers in the input/output circuit 160, and supplied via the input/output circuit 160 and the read/write amplifiers 155 to the memory array 150 and written in the memory cell designated by the row address and the column address.

Turning to the explanation of the external terminals included in the semiconductor device 100, the clock terminals CK and/CK are supplied with an external clock signal and a complementary external clock signal, respectively. The external clock signals (including complementary external clock signal) may be supplied to a clock input circuit 105. The clock input circuit 105 may receive the external clock signals to generate an internal clock signal ICLK. The internal clock signal ICLK is supplied to an internal clock generator 130 and thus a phase controlled internal clock signal LCLK is generated based on the received internal clock signal ICLK and a clock enable signal CKE from the address/command input circuit 105. Although not limited thereto, a DLL circuit can be used as the internal clock generator 130. The phase controlled internal clock signal LCLK is supplied to the input/output circuit 160 and is used as a timing signal for determining an output timing of read data. The internal clock signal ICLK is also supplied to a timing generator 135 and thus various internal clock signals can be generated.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. The reference potential ZQVREF is used in the ZQ calibration circuit 165.

The power supply terminals are also supplied with power supply potentials VDDQ and VSSQ. These power supply potentials VDDQ and VSSQ are supplied to the input/output circuit 160. The power supply potentials VDDQ and VSSQ are the same potentials as the power supply potentials VDD and VSS, respectively. However, the dedicated power supply potentials VDDQ and VSSQ are used for the input/output circuit 160 so that power supply noise generated by the input/output circuit 160 does not propagate to the other circuit blocks.

The calibration terminal ZQ is connected to the ZQ calibration circuit 165. The ZQ calibration circuit 165 performs a calibration operation with reference to an impedance of RZQ, and the reference potential ZQVREF, when activated by the ZQ calibration command signal (ZQ_com). An impedance code ZQCODE obtained by the calibration operation is supplied to the input/output circuit 160, and thus an impedance of an output buffer (not shown) included in the input/output circuit 160 is specified.

As previously discussed, the command decoder 115 decodes the command signal and generates various internal commands. For example, the command decoder 115 may generate the test mode write internal control signal responsive to a test mode write internal command. When the test mode command is issued, via the command decoder 115, and received by the test mode circuit 125, the test mode circuit may output a test mode control signal, such as a test mode write internal control signal (tm_wrint), to the I/O circuit 160. In response to receiving the test mode write internal control signal, the I/O circuit 160 may be configured to enter a test mode configuration such that data may be written to the memory array 150, and read from the memory array 150, at high speeds without using data receivers of the I/O circuit 160. In other words, test data may be written into the memory array 150 internally, without relying on data receivers, thus allowing write data testing to be performed without input from an external system.

Figure 2:
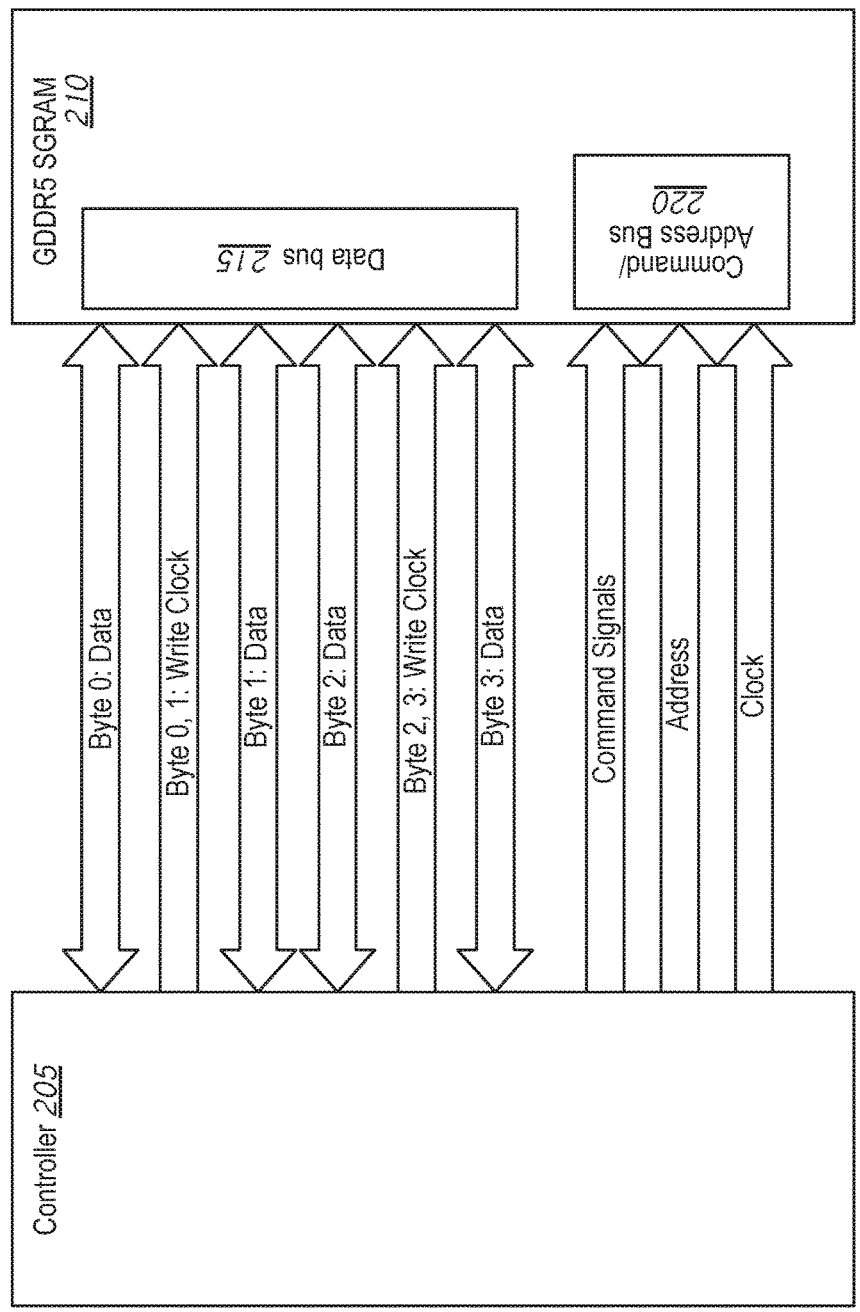
FIG. 2 is a schematic block diagram of a GDDR5 interface, in accordance with various embodiments.

FIG. 2 is a schematic block diagram of a GDDR5 interface 200, in accordance with various embodiments. FIG. 2 depicts the interface between a controller 205 and GDDR5 SGRAM 210. The GDDR5 SGRAM 210 may include a data bus 215. The data bus 215 may be configured to transmit and receive data, to and from the controller 205. The GDDR5 SGRAM 210 may also include a command/address bus 220 configured to receive commands and address information from the controller 205. In various embodiments, the controller 205 may include a memory controller as known in the art, including without limitation, an integrated memory controller, or separate chip.

The GDDR5 interface 200 may be divided into several channels, each channel being 32-bits wide. Each channel may include a single GDDR5 SGRAM 210 operating in x32 mode, utilizing a single 32-bit data bus 215. Alternatively, two GDDR5 SGRAM 210 may be operated in x16 or "clamshell" mode. In x16 mode, the data bus 215 may be split into two 16-bit wide buses routed to each of the two GDDR SGRAM 210 devices separately. Address and command pins may be shared between the two GDDR5 SGRAM 210 devices, preserving the total I/O pin count at the controller 205, without decreasing system performance. Clamshell mode may essentially double memory density on an x32 GDDR5 channel by changing frame buffer size.

Typically, GDDR5 SGRAM 210 utilizes a scheme with direct latching data receivers and no delay matching between the data receiver and differential forwarded clock signal (write clock), WCK. The controller 205 determines the optimum phase relationship between write data and the WCK clock for each data pin through a process of data training, as will be described in more detail below with reference to FIG. 3.

Figure 3:
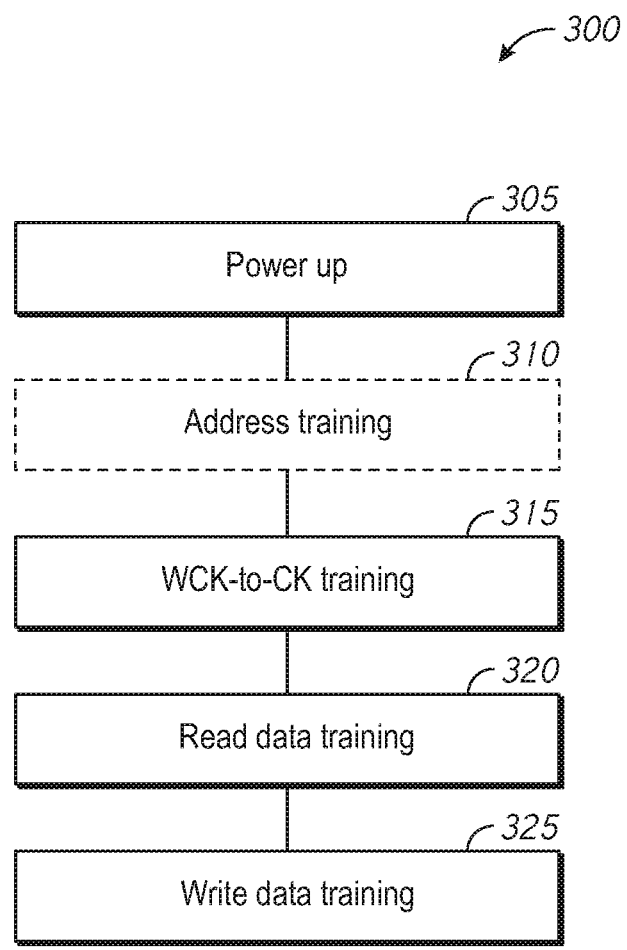
FIG. 3 is a flow diagram of a method for GDDR5 interface training, in accordance with various embodiments.

GDDR5 provides hardware support for adaptive interface training to ensure GDDR5 SGRAM 210 device operates with the widest timing margins on all signals. Conventionally, interface training is operated by controller 205, with timing adjustments also made by the controller 205. FIG. 3 is a flow diagram of a method 300 for GDDR5 interface training, in accordance with various embodiments. The method 300 begins at block 305, by first powering up. Upon power up, device configuration in x32 or x16 mode, and on-die terminations for the address/command lines are set.

At optional block 310, an address training procedure may be completed. Address training may be used to center the address input data eye. In some embodiments, address training mode uses an internal bridge between the device's address input and data outputs. A special READ command is utilized for address capture, which are then synchronously output to the controller via the data output pins, for example, the DQ and DBI_n pins depicted in FIG. 2. The controller may then compare the address patterns to an expected value and adjust address transmit timings accordingly.

At block 315, WCK-to-CK training may be performed. WCK and CK clock signals require a specific phase relationship that varies depending on the device. This phase relationship ensures a reliable phase-over of write data from the external WCK clock domain to the internal CK clock domain. Similarly, the same phase relationship ensures a reliable phase-over of read data, from the internal CK clock domain to the external WCK clock domain, and of the output drivers. This helps to define READ and WRITE latencies between the device and the memory controller. In some embodiments, WCK-to-CK training may be initiated by the controller. The controller may sweep the WCK clocks against the CK clock. The device may respond by a static signal indicating an "early" or "late" clock phase. The optimum phase relationship may be indicated by the transition from early to late phase.

The method 300 continues, at block 320, by performing read training. Read training may enable a controller to find the data eye center and burst frame location for each output from the GDDR5 device. In some embodiments, read training may align the data bus to the WCK clock. This may include two parts: 1) aligning the latching clock in the memory controller to the center of a read data bit; and 2) detecting burst boundaries out of a continuous read data stream. In further embodiments, a read buffer may be utilized to function as temporary storage for read data. The read buffer may be preloaded with test data that may be transmitted over a previous trained address bus. Once read buffer is loaded with test data, a read command may be issued by the controller repeatedly. The controller may then sweep its clock phase until the data is correctly sampled.

At block 325, write training is performed. Write training enables the memory controller to find a data eye center and burst frame location for write data, for each high-speed input of the DRAM. In some embodiments, write training may be the final step in interface training, aligning the data bus to the WCK clock. Analogous to read training, write training may include two parts: 1) aligning the latching clock in the DRAM to the center of the write data bit; and 2) detecting the burst boundaries of a continuous write data stream. As will be discussed in more detail in the embodiments below, unlike conventional write training, test data may be loaded into a write buffer via the address bus, without utilizing data receivers. The test data may then be written into the DRAM, and read from the DRAM into the read buffer. The memory controller may then read the test data from the read buffer, and sweep the write data phase until the data is written correctly. After write training, all data eyes are expected to be centered.

Figure 4:
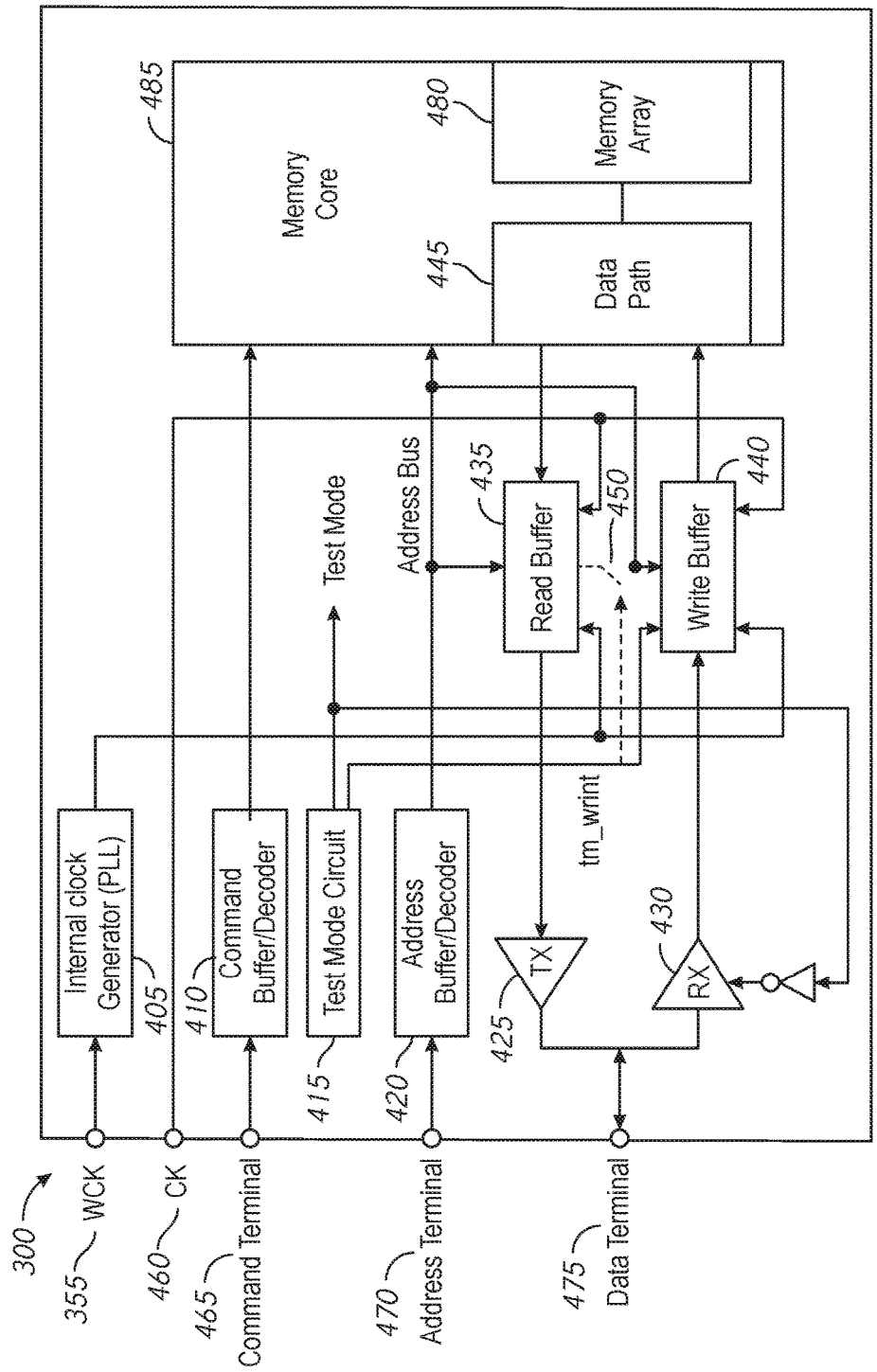
FIG. 4 is a schematic block diagram of test mode circuitry in a semiconductor device, in accordance with various embodiments.

FIG. 4 is a schematic block diagram of an arrangement of test mode circuitry in a semiconductor device 400, in accordance with various embodiments. The following discussion will make reference to FIG. 4 regarding a configuration for implementing test mode operations, including write training as described above with respect to FIG. 3. The semiconductor device 400 may be similar to the semiconductor device 100 of FIG. 1. For example, the semiconductor device 400 may include an internal clock generator (PLL) 405, command buffer/decoder 410, test circuit 415, address buffer/decoder 420, a memory core 485 including a data path 445 and memory array 480, clock input terminals WCK 455 and CK 460, command terminal 465, address terminal 470, and data terminal 475. FIG. 4, however, depicts various components of the I/O circuit 160 of semiconductor device 100 in greater detail that may be used during test mode operation. For example, the I/O circuit 160 may include, without limitation, a data receiver Rx 425, data transmitter Tx 430, read buffer 435, write buffer 440, and switch 450. In some instances, the read and write buffers may be first in first out (FIFO) buffers, and may alternatively be referred to as read FIFO 435 and write FIFO 440.

In the embodiments depicted, WCK 455 may correspond to a write clock signal associated with the data terminal 475, whereas CK 460 may correspond to a command clock associated with the command terminal 465. In some embodiments, because WCK 455 and CK 460 may be asynchronous, for example, having different clock frequencies external to the semiconductor device 400. The write buffer 440 may be configured to account for the clock frequency differences. Thus, in some embodiments, the internal clock generator 405 may be configured to generate an internal PLL clock signal derived from WCK 455. In some embodiments, the internal PLL clock signal may have the same clock frequency as CK 460. For synchronization of the two clock domains, WCK 455 and CK 460, the write buffer 440 may be utilized to transfer data from the WCK 455 domain to the CK 460 domain before writing to the memory array 480. It is to be understood that in other embodiments, WCK 455 and CK 460 may be synchronized externally, such that a separate write buffer 440 may not be necessary.

In response to receiving test mode control signals from the test mode circuit 415, the I/O circuit 160 may enter a test mode. For example, in some embodiments, the test mode control signals may include, without limitation, tm_wrint and a test mode control signal configured to disable the data receiver Rx 430. Disabling may include, without limitation, shutting off or otherwise preventing the data receiver Rx 430 from outputting data to the write buffer 440. Therefore, the input of the write buffer 440 may be disconnected from Rx 430. In some embodiments, tm_wrint and the test mode control signal for disabling Rx 430 may be separate signals while in other embodiments, a single test mode control signal may be used.

In some embodiments, while in test mode, the I/O circuit 160 may be configured to disable data receiver Rx 430, and load test data into the read buffer 435, write buffer 440, or both read and write buffers 435, 440, via the address bus. For example, as depicted in FIG. 4, in some embodiments, the write buffer 440 may have a second input coupled to the address bus. In embodiments where the write buffer 435 can be loaded directly from the address bus, the switch 450 may be optional.

In other embodiments, while in test mode, the I/O circuit 160 may be configured to couple the read buffer 435 to the write buffer 440 via the switch 450. For example, the write buffer 440 may have a second input that may be coupled to the switch 450. Thus, when test mode is entered, the switch 450 may be closed, connecting the read buffer 435 to the second input of the write buffer 440 such that test data may be loaded, from the read buffer 435, into the write buffer 440.

In some embodiments, the test mode may be utilized for interface training, as discussed previously with respect to FIG. 2. For interface training, a load FIFO command (LDFF) may be utilized. The LDFF command may cause the read buffer 435 to be loaded with a test data sequence (LDFF data) without accessing the memory array 480. The contents of the read buffer 435 may then be read by the controller in order to find the read data eye. In some embodiments, the LDFF data may be provided to the read buffer 435 via the address bus. The address bus may have half or a quarter of the data rate of the data terminal 475. It will be appreciated by those of ordinary skill in the art that the speed at which LDFF data is loaded is not critical. The LDFF command, thus, loads the read buffer 435 of the device 400 and generates an input pointer trigger for the read buffer 435, wherein the input pointer trigger may enable or disable the input pointer of the read buffer 435 from updating.

In addition, in test mode, if tm_wrint is also enabled, the LDFF command may also be used to load LDFF data into the write buffer 440 via the address bus. Similarly, the LDFF command may disable the input pointer of the write buffer 440 and the data receivers 430. Thus, LDFF data may be written directly from the write buffer into the memory array 480 with a full-speed write operation, in order to test the data path 445. Therefore, in these embodiments, after entering test mode and tm_wrint is enabled, the write buffer 440 may be loaded, via the address bus, by issuing LDFF commands and written to the memory array 480 by issuing write commands. In an alternative embodiment, the test data sequence may be loaded into the write buffer 440 through the data receiver 430 after initializing the test mode. After the write buffer 440 is loaded with the test data sequence through the data receiver 430, the data receiver 430 may be disabled as described above.

The test data sequence may be configured to stress the data paths 445 to and from the memory array 150, 480. The test data sequence may follow a pattern or have the same bit value. The read buffer 435 and write buffer 440, in some embodiments, may be a FIFO buffer with a depth of two or more. For example, in some embodiments, the test data sequence may include alternating A data and B data sequences stored in the write buffer 440 with a depth of two.

Accordingly, in one example, the data terminal 475 may comprise 32 data pins into the write buffer 440. In this example, a burst length of 16 bits per input line may be utilized, for a total of 512 bits. The write buffer 440 may correspondingly output the 512-bits of the test data sequence to the memory array 480 in parallel, each time a write command is issued. Similarly, in a write buffer 440 with a depth of two, two test data sequences, 512-bits each, may be stored in the write buffer 440 concurrently. Thus, when test mode is entered and the data receiver 430 is disabled, the input pointer for the write buffer 440 may also be disabled, preventing further data from being written into the write buffer 440. At the same time, the output pointer of the write buffer 440 may continue to be updated after each write command. This allows the write buffer 440 to cycle through outputting the one or more test data sequence(s) that are already loaded in the write buffer 440 on subsequent write commands.

In some embodiments, when the test signal tm_wrint changes its logical level, for example, from logic low to logic high, the switch 450 may turn on, entering a conductive state. Consequently, the data stored in read buffer 435 may be loaded into the write buffer 440. In other embodiments, the test data sequence may be loaded from the address bus into the read buffer 435 and write buffer 440 concurrently. In some embodiments, the test data sequence may be loaded into the read buffer 435 and/or write buffer 440 serially, as received through address terminal 470 and via the address bus. In an alternative embodiment, the test data sequence(s) may be loaded into the write buffer 440, but not the read buffer 435. The read buffer 435 may, in turn, only be loaded with the test data sequence as read from the memory array 480. As described previously, once the test data sequence is loaded into the write buffer 440, a write command may be issued by the controller to write the test data sequence into the memory array 480, at full speed.

After the test data sequence is written to the memory array 480, the test data sequence may be read out from memory array 480 to the read buffer 435, and out to a memory controller for processing. For example, in some embodiments, the memory controller may check for and identify errors in the retrieved test data sequence, analyze performance metrics, or perform other test functions as appropriate.

Figure 5:
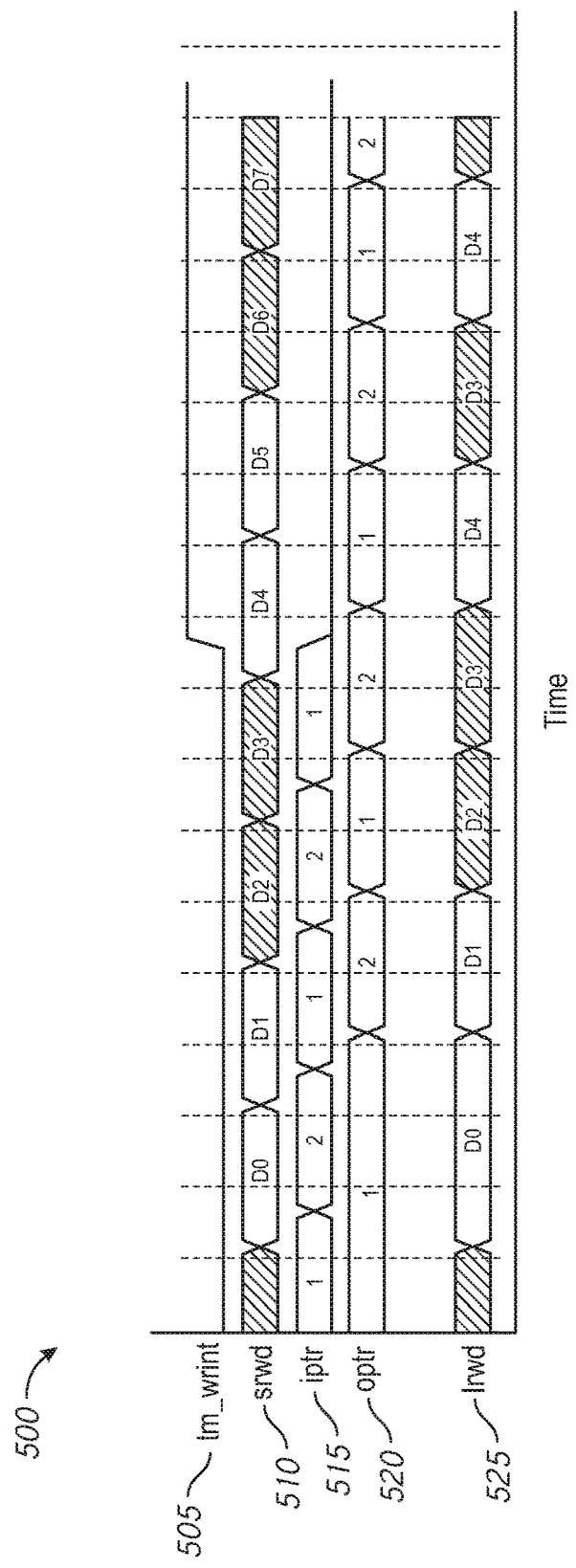
FIG. 5 is a timing diagram of a memory device in test mode, in accordance with various embodiments.

FIG. 5 is a timing diagram 500 of a memory device in test mode, in accordance with various embodiments. The timing diagram 500 includes test mode write internal signal tm_wrint 505, external receiver data (srwd) 510, write buffer input pointer (iptr) 515, write buffer output pointer (optr) 520, and write buffer output data (lrwd) 525. Accordingly, as seen in srwd 510, external data D0-D7 may be received by the data receiver 530, based on WCK 555. Similarly, while tm_wrint 505 is not asserted, iptr may continue to be cycled, in this case between a first input and second pointer locations. However, when tm_wrint 505 is asserted, the iptr 515 is disabled or otherwise prevented from being updated. As depicted, in some embodiments, D3 and D4 may be test data sequences that were loaded into write buffer 540 via the address bus. Thus, tm_wrint 505 may be asserted after the test data sequences have already been loaded into the write buffer 540.

In contrast with iptr 515, however, optr 520 may be allowed to continually cycle between the first and second pointer locations, outputting data stored in each of the respective pointer locations. Thus, as depicted by lrwd 525, while tm_wrint 505 is not asserted, data may be read from srwd 510 and output by the output buffer. However, when tm_wrint 505 is asserted, data D4 is loaded into the first pointer location, while data D3 remains loaded in the second pointer location. Because iptr 515 is not updated, and because connection to the data receiver has disabled, data D3 and D4 is not rewritten in the write buffer. Thus, the write buffer is able to continually switch its output between data D3 and data D4, allowing for full-speed write operations in test mode, without waiting for data to be continually loaded into the write buffer.

Figure 6:
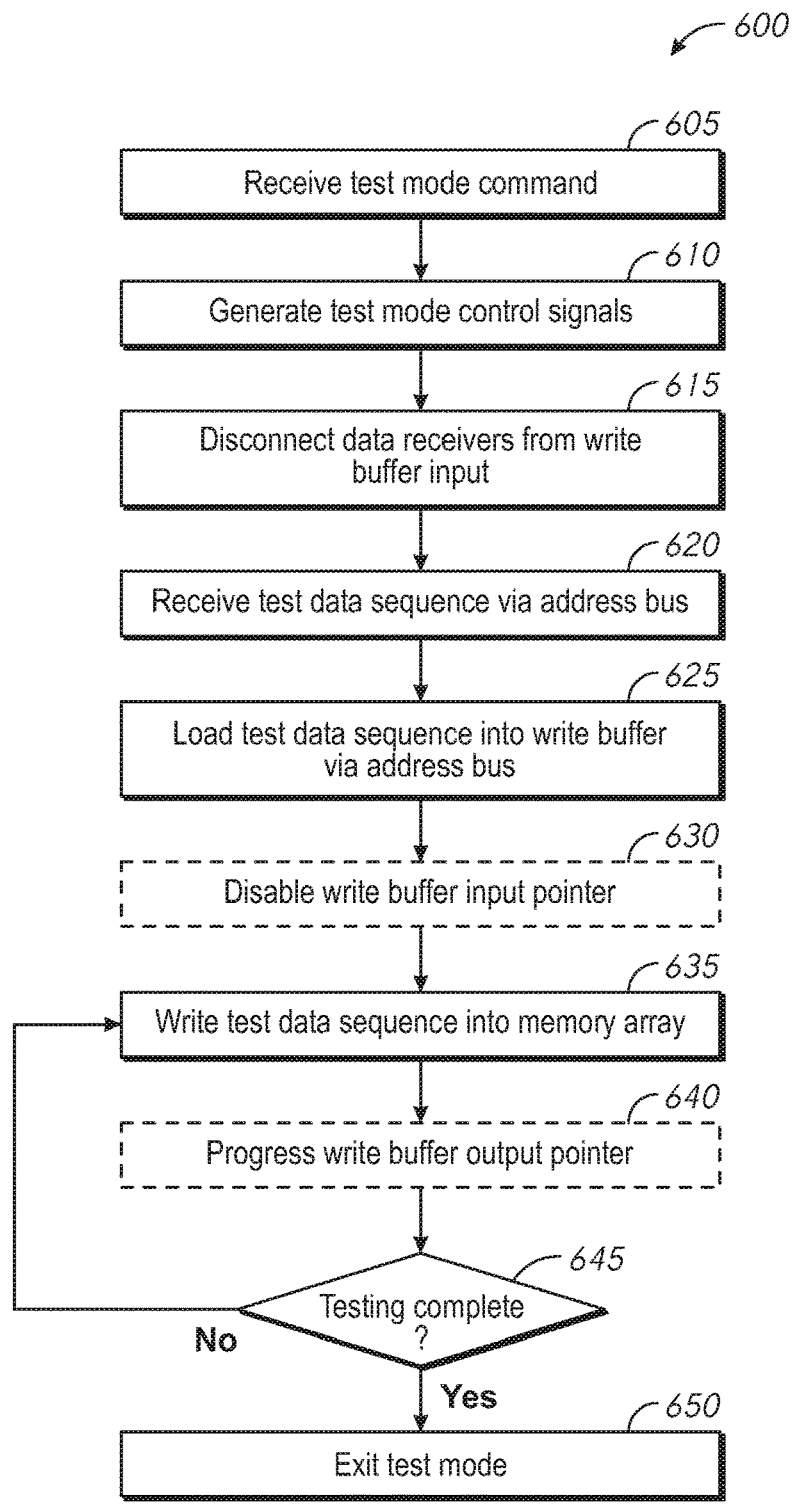
FIG. 6 is a flow diagram of a method of implementing a test mode, in accordance with various embodiments.

FIG. 6 is a flow diagram of a method 600 of implementing a test mode, in accordance with various embodiments. The method 600 begins, at block 605, by receiving a test mode command. The test mode command may be issued externally by the memory controller and received by the test mode circuit. Once received by the test mode circuit, at block 610, test mode control signals are generated by the test mode circuit. As discussed with respect to the embodiments above, test mode control signals may include a tm_wrint signal. Accordingly, at block 615, the data receivers may be disconnected from the write buffer input. In some embodiments, the test mode control signals may disable the data receivers, preventing the write buffer from reading data from the data receivers. In other embodiments, the test mode control signal may cause the write buffer to switch between different inputs from which the write buffer reads data. For example, in some embodiments, the write buffer input may be switched from an input coupled to the data receiver, to a second input coupled to the address bus or, alternatively, the read buffer. In yet further embodiments, the test mode control signals may both disable the data receivers and cause the write buffer to read data from an input coupled to the address bus.

At block 620, the method 600 progresses by receiving a test data sequence on the address bus. In some embodiments, the test mode control signals may cause a test data sequence to be retrieved, via the address terminal, and output on the address bus. Once loaded on the address bus, at block 625, the test data sequence may be loaded into the write buffer via the address bus.

At optional block 630, in embodiments in which the write buffer includes multiple input pointer locations, the write buffer input pointer may be disabled. Thus, once the loading of all test data sequences are complete, new data may be prevented from being read into write buffer. At block 635, the test data sequence may be written to the memory array 635. Because the test data sequence is written from the write buffer, the test data sequence may be written to the memory array at full write speed, with each write command. At optional block 640, the write buffer output pointer may then be progressed to the next output pointer location. In some embodiments, the write buffer may have a depth of two. Thus, each time a test data sequence is written to the memory array, the output pointer may switch between the two output pointer locations, each of the two output pointer locations corresponding to a respective test data sequence. For example, in some embodiments, writes from the write buffer may alternate between a first test data sequence, Data A, and a second test data sequence, Data B.

At decision block 645, it may be determined whether testing is complete. If testing is not complete, the test data sequence may be written, at block 635, from the write buffer into memory upon receiving a write command, and at optional block 640, again progress the write buffer output pointer. If testing is completed, the method progresses, at block 650, to exit test mode.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. A apparatus comprising:
a memory core;
a data terminal;
a write buffer comprising a first input and a second input separate from the first input, the write buffer configured to receive at the first input first data transferred through a first path including the data terminal and supply the first data to the memory core, the write buffer being further configured to receive at the second input second data transferred through a second path excluding the data terminal and supply the second data to the memory core.

2. The apparatus of claim 1, wherein the write buffer temporarily stores data to be transferred to the memory core.

3. The apparatus of claim 2, further comprising a read buffer temporarily stores data read out from the memory core in normal mode.

4. The apparatus of claim 3, wherein the read buffer is configured to be loaded with data via an address bus in test mode.

5. The apparatus of claim 4, wherein data stored in the read buffer is provided via the address bus, and wherein a switch is provided to transfer the data stored in the read buffer into the write buffer via the second input.

6. The apparatus of claim 1, wherein the second input is coupled to an address bus.

7. The apparatus of claim 1, wherein the write buffer is a first in, first out buffer.

8. The apparatus of claim 7, wherein the write buffer has a FIFO depth of two.

9. The apparatus of claim 1, wherein in test mode, the write buffer is configured to store at a first pointer location a first test data sequence, and at a second pointer location a second test data sequence.

10. The apparatus of claim 9, wherein the first test data sequence and second test data sequence are written to the memory core in an alternating manner.

* * * * *